United States Patent [19]
Scepanovic et al.

[11] Patent Number: 5,638,293
[45] Date of Patent: Jun. 10, 1997

[54] OPTIMAL PAD LOCATION METHOD FOR MICROELECTRONIC CIRCUIT CELL PLACEMENT

[75] Inventors: Ranko Scepanovic, Cupertino; Patrik D'Haeseleer, Atherton, both of Calif.

[73] Assignee: LSI Logic Corporation, Milpitas, Calif.

[21] Appl. No.: 306,189

[22] Filed: Sep. 13, 1994

[51] Int. Cl.$^6$ ................................. G06F 17/00
[52] U.S. Cl. ........................... 364/491; 364/490
[58] Field of Search ................... 364/488, 489, 364/490, 491, 474.35, 474.36

[56] References Cited

U.S. PATENT DOCUMENTS

| | | | |
|---|---|---|---|
| 3,603,771 | 9/1971 | Isett | 364/491 |
| 4,577,276 | 3/1986 | Dunlop et al. | 364/491 |
| 5,072,402 | 12/1991 | Ashtaputre et al. | 364/489 |
| 5,119,313 | 6/1992 | Shaw et al. | 364/488 |
| 5,231,590 | 7/1993 | Kumar et al. | 364/491 |
| 5,267,176 | 11/1993 | Antreich et al. | 364/489 |
| 5,267,177 | 11/1993 | Sato et al. | 364/489 |
| 5,303,161 | 4/1994 | Burns et al. | 364/490 |
| 5,404,313 | 4/1995 | Shiohara et al. | 364/490 |

OTHER PUBLICATIONS

Wang, Deborah C., *Pad Placement and Ring Routing for Custom Chip Layout*, IEEE, 1990, Paper 10.3, pp. 193–199.
Yao, Xianjin and Liu, L.C.,*A New Approach to the Pin Assignment Problem*, IEEE Transactionson Computer–Aided Design, vol. 8, No. 9, Sep., 1989, pp. 999–1006.
Pedram, Massoud, Marck–Sadowska, Malgorzara, Kuh, Ernest S., *Floorplanning with Pin Assignment*, IEEE, 1990, pp. 98–101.

Cong, Jingsheng (Jason), *Pin Assignment with Global Routing*, IEEE, 1989, pp. 302–305.
Yao et al., "A New Approach to the Pin Assignment Problem", ACM/IEEE Design Automation Conf., 1988, pp. 566–572.
Pedram et al., "I/O Pod Assignment based on the Circuit Structure", Proc of 1991 IEEE Int'l Conf on Comp Design – VLSI Comp. pp. 314–318.
Cong, "Pin Assignment w/Global Routing for General Cell Designs", IEEE Trans on CAD, vol. 10, No. 11, Nov. 1991, pp. 1401–1412.
Wang, et al., "Simultaneous Pin Assignment & Global Wiring For Custom VLSI Design", Proc of 1991 IEEE Conf on Comp Design, pp. 2128–2131.

*Primary Examiner*—Kevin J. Teska
*Assistant Examiner*—Tyrone V. Walker
*Attorney, Agent, or Firm*—Poms, Smith, Lande & Rose, P.C.

[57] ABSTRACT

A cell placement is generated for a microelectronic circuit chip. Interconnect points for cell nets are calculated, for example, as gravity points of the cells of the respective nets. Optimal positions for external connection terminals or pads along the border of the circuit are calculated as being the closest positions to the respective interconnect points. The total wirelength of the placement is calculated as including the distances between the interconnect points and the respective pads. Where initial location of the pads results in overlap thereof, clusters of pads are identified and expanded to remove the overlap. Concatenated overlapping clusters resulting from expansion are treated as new clusters and subsequently expanded until all overlap is eliminated. The centers of gravity of the clusters are preserved. During the overlap removal process, initial rectangular coordinates of the pad positions are converted into linear coordinates along the border. After the overlap is eliminated, the linear coordinates are converted back to rectangular coordinates.

7 Claims, 6 Drawing Sheets

OPTIMAL PAD LOCATION METHOD FOR MICROELECTRONIC CIRCUIT CELL PLACEMENT

BACKGROUND OF THE INVENTION

1. Field of the Invention

The present invention generally relates to the art of microelectronic integrated circuits, and more specifically to a method for optimally locating external electrical connection pad positions for a microelectronic circuit cell placement.

2. Description of the Related Art

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield. The arrangement of individual cells in an integrated circuit chip is known as a cell placement.

Each microelectronic circuit device or cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

Prior art methods for achieving this goal comprise generating one or more initial placements, modifying the placements using optimization methodologies including Genetic Algorithms such as simulated evolution, force directed placement or simulated annealing, and comparing the resulting placements using a cost criteria.

In conventional chip design, the positions of certain "unmovable" cells (external interconnect terminals or pads, large "megacells" etc.) will be fixed a priori by the designer. Given those fixed positions, the rest of the cells are then placed on the chip. Since the unmovable cells and pads are located or placed before the placement for the rest of the cells of chip has been decided on, it is unlikely that the chosen positions will be optimal.

Optimization of the cell placement for minimization of the total wirelength of the interconnects must take into account the lengths of the wires between the internal interconnect nets and the pads that are located on the border of the chip. If the pad positions are specified before the cell placement operation is performed, the wirelengths associated with the with the pads will only be optimized for the predetermined non-optimal pad positions.

Also, in the prior art, when the pad placement is done a priori, the lengths of the wires leading to the pads are not even known, because the positions in the individual nets of the placement that are to be connected to the pads have not been specified. Thus, the cell placement and pad placement operations are separate, and do not receive any benefit from each other.

SUMMARY OF THE INVENTION

An object of the present invention is to improve the placement of cells on a chip. The present method overcomes the problem of placement of external interconnect terminals or pads on the border of the chip by allowing the pads to be moved during the process of constructing the overall cell placement of the chip.

The present method can also be used for solving the optimal pin assignment problem for a microelectronic circuit block or module in a hierarchical layout approach, if optimality is defined from the point of view of optimal placement inside the block. In this case, the terminals are constituted by the pins of the block.

The present invention accomplishes two specific goals.

1. Providing a more accurate measurement of the wirelength component of the cost function used to evaluate the cell placement, where movable pads are used.

2. Providing an actual placement for the movable pads in case the placement algorithm needs it, for example at every iteration of an iterated placement algorithm in which the placement of the pads affects the placement of the cells at the next generation, or to calculate the pad positions at the end of the cell placement.

The present method can be used with any placement algorithm because it applies the placement algorithm only to movable cells, defines how to compute the cost function, and then when the placement algorithm stops determines the pad positions without affecting the value of the cost function (the pad positions will be determined in the calculation of the cost function).

More specifically, in accordance with the present method, a cell placement is generated for a microelectronic circuit chip. Interconnect points for cell nets are calculated, for example, as gravity points for the cells of the respective nets.

Optimal positions for external connection terminals or pads along the border of the circuit are calculated as being the closest points to the respective interconnect points. The total wirelength of the placement is calculated as including the distances between the interconnect points and the respective pads.

If actual legal pad positions need to be calculated, where initial location of the pads results in overlap thereof, clusters of pads are identified and expanded to remove the overlap. Concatenated overlapping clusters resulting from expansion are treated as new clusters and subsequently expanded until all overlap is eliminated. The centers of gravity of the clusters are preserved.

During the overlap removal process, initial rectangular coordinates of the pad positions are converted into linear coordinates along the border. After the overlap is eliminated, the linear coordinates are converted back to rectangular coordinates.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
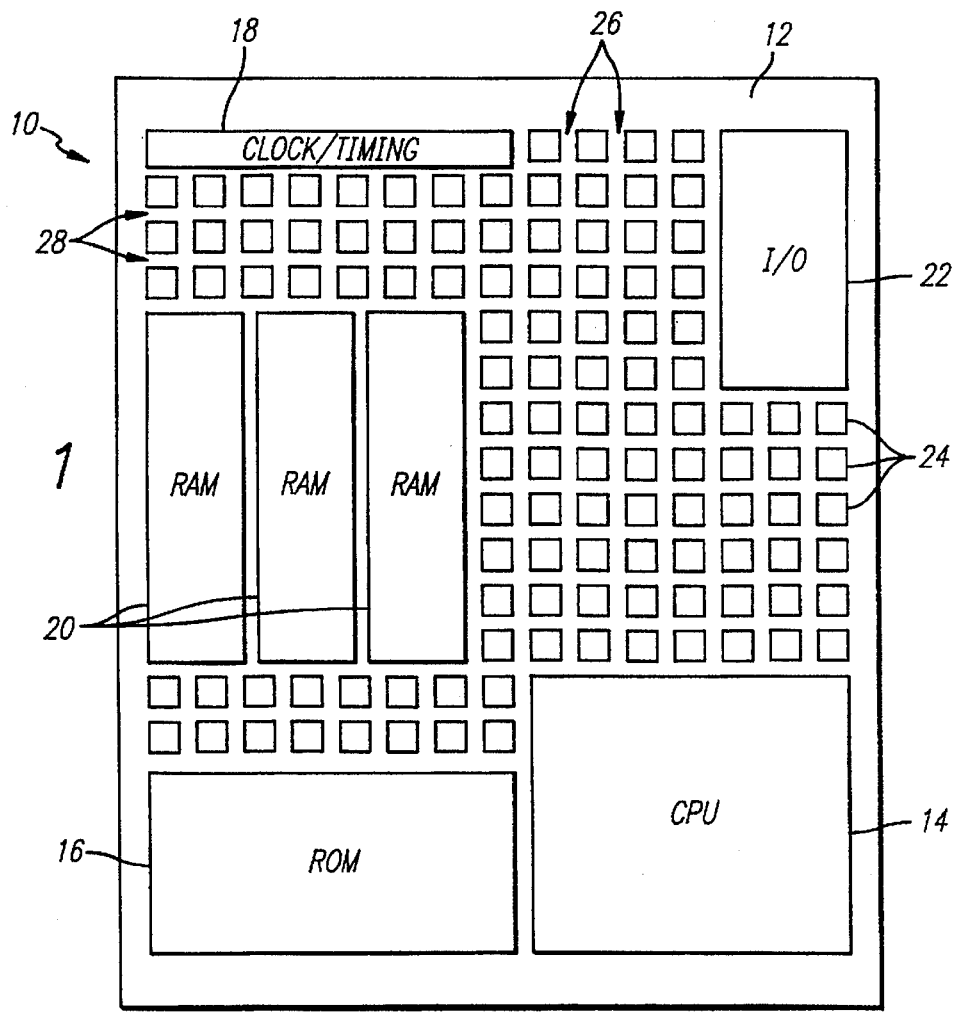
FIG. 1 is a simplified diagram illustrating an integrated circuit chip which can be optimally designed in accordance with the present invention.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24.

Figure 2:
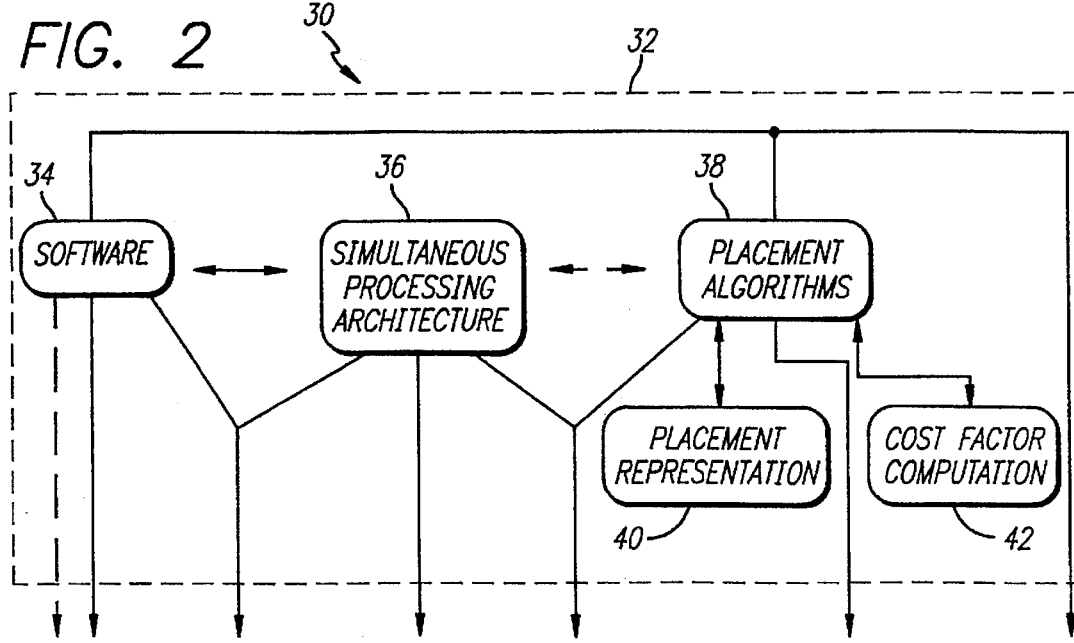
FIG. 2 is a diagram illustrating the main blocks of a multi-processing optimization system for practicing a method of the present invention.

FIG. 2 illustrates an integrated circuit physical design automation system 30 for producing an optimized placement of the cells 24 such as illustrated in FIG. 1 in accordance with a method of the present invention.

The system 30 receives inputs for a user specified integrated circuit design including a netlist, a library of standardized microelectronic elements or cells and functional units including combinations of cells, and a set of rules that define the objectives of the design.

The system 30 decomposes these inputs into a plurality of parallel processes or tasks that are executed simultaneously using individual processing units. In general, one or more processors coordinate the operation of other processors, which are optimized, evaluated and recombined to produce an optimal cell placement which may or may not satisfy a predetermined performance objective.

The optimal cell placement produced by the system 30 is used to generate masks for fabrication of the desired integrated circuit chip.

The system 30 comprises a global operating system 32 that generally controls and coordinates the operation of parallel processing software 34 and simultaneous processing architecture 36.

The architecture 36 includes a plurality of parallel processors and a memory structure for simultaneously executing methodologies or placement algorithms 38 for measuring the relative costs of cell placements and minimizing the costs. Implementation of the algorithms 38 is facilitated by a cell placement representation 40 and cost function or factor computation 42. The architecture 36 can be of any type, such as Distributed Shared Memory (DSM), that enables parallel processing in accordance with the method of the invention.

The present method can be used in combination with placement algorithms 38 including force directed cell placement, simulated annealing, genetic algorithms or any other suitable methodology.

The method overcomes the problem of placement of external interconnect terminals or pads on the border of the chip by allowing the pads to be moved during the process of constructing the overall cell placement of the chip.

The method can also be used for solving the optimal pin assignment problem for a microelectronic circuit block in a hierarchical layout approach, if optimality is defined from the point of view of optimal placement within the block. In this case, the terminals are constituted by the pins of the blocks.

This method can be used with any placement algorithm because is applies the placement algorithm only to movable cells, defines how to compute the cost function and then when the placement algorithm stops determines the pad positions without affecting the value of the cost function (the pad positions will be determined in the calculation of the cost function).

The placement problem can be generally stated as: for a given set of n "movable" cells (cells) and k "unmovable" cells (pads), place the cells within a given rectangular region and the pads on the border of that region such that some cost function (e.g. total wire length) is minimized.

The present method uses the following algorithm: assume that the cost function is the total wire length (this is not a restriction because in general any placement cost function contains as a component total wire length, and the method modifies only this component).

Figure 3:
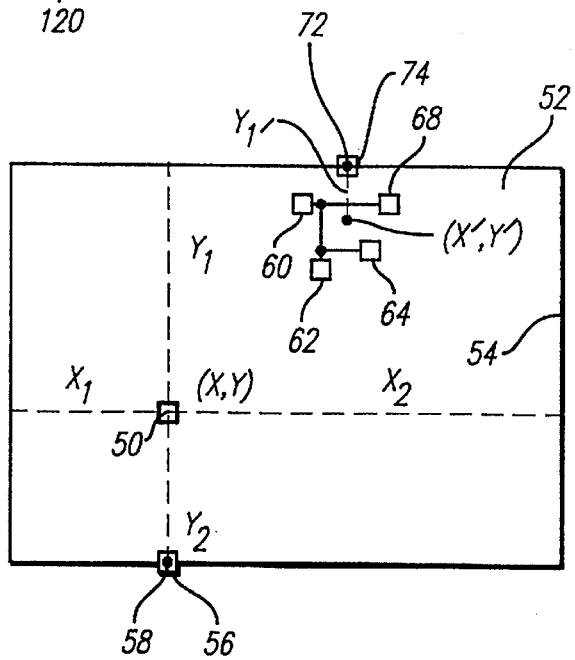
FIG. 3 is a diagram illustrating calculation of an external interconnect terminal or pad position in accordance with a method of the present invention.

The problem can be simplified as illustrated in FIG. 3 by assuming that each pad is connected to only one movable cell. The problem is how to compute the length of a cell connection to a pad without having a priori coordinates for that pad location.

Consider a cell 50 that is located at a position x,y on a chip or microelectronic circuit block 52 having a border 54. The position x,y is considered as an interconnect point for connection of the cell 50 to a pad on the border 54.

The distances from the cell 50 to the four sides of the chip border 54 are $x_1$, $x_2$, $y_1$ and $y_2$. The minimum wire length cost associated with the connection between the cell 50 and the pad to which it is to be connected is given as min $\{x_1, x_2, y_1, y_2\}$, and the optimal pad position is determined by this minimal value. In the illustrated example, a pad 56 is optimally located at a position 58 on the border 54 that is spaced from the cell 50 by the distance min $\{x_1, x_2, y_1, y_2\}$= $Y_2$, since the distance $y_2$ is the minimum distance from the cell 50 to the border 54.

In general, the optimal position for a pad is the position on the border closest to the cell to which the pad is connected. In this manner, pads can be considered as being movable along the border of the chip or block during placement optimization without directly having to apply the placement algorithm to the pads themselves. When the algorithm stops, the pad positions can be computed according to the instantaneous value of cost function.

Obviously, if some pad positions are predetermined for some reason, the lengths of connections to these pads are computed directly (e.g. the rectilinear distance between them).

If a pad is connected to not just one but several other cells by means of an interconnect net, finding the optimal pad position becomes less straightforward. An algorithm is used to find an approximation of the optimal placement of a cell that is not restricted to falling on the border of the chip. Applying the algorithm to the pad in question will yield x',y' as an interconnect point inside the chip. The position on the border 54 that is closest to this position x',y' provides an acceptably accurate approximation of the optimal pad position.

More specifically, FIG. 3 further illustrates a plurality of cells 60, 62, 64 and 68 that are interconnected by a net 70. The interconnect position x',y' can be calculated as the gravity point (center of gravity), median interval or other predetermined function of the positions of the cells 60, 62, 64 and 66. Calculation of the center of gravity of a number of points, for example, is a simple problem in plane geometry, and will not be described in detail.

An optimal pad position 72 for a pad 74 that provides external connection for the net 70 is determined in the same manner as described above for the case of the single cell 50. The interconnect point x',y' is closest to the upper edge of the border 54 and spaced from the optimal pad position 72 by a distance $y_1'$.

Whenever actual pad placements are needed, either because the placement algorithm requires pad positions for determining cell positions in the next iteration (such as when using gravity point based placement optimization algorithms) or after the cell placement finishes, initial positions for these pads are computed according to the above description.

Location of movable pads in accordance with the present invention enables the calculation of a total wirelength for a placement. The total wirelength is equal to the total wirelength of all of the nets of the placement plus the lengths of the wires connecting the nets to the pads.

The wirelengths for the pads are the minimum distances to the border as described above. The wirelength for each net can be approximated as being equal to the half-perimeter of a bounding box surrounding the cells of the net. The total wirelength for the nets is the sum of the half-perimeters of the individual nets.

Figure 5:
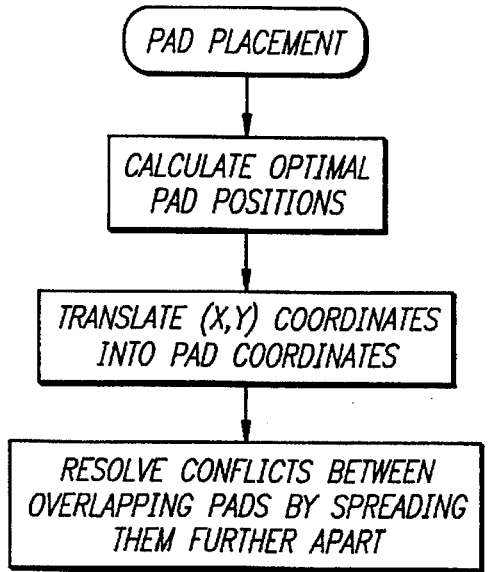
FIG. 5 is a flowchart illustrating how overlap between pads is removed in accordance with the invention.

The most basic form of the present method as described above does not take pad sizes, overlap between pads, etc. into account. Therefore, after all optimal pad positions have been calculated it may be necessary to spread some of the pads apart to remove overlap. To do this, each pad position is transformed into a single pad coordinate indicating its position along the border. Conflicts between coordinates are then removed as illustrated in the flowchart of FIG. 5.

Figure 7:
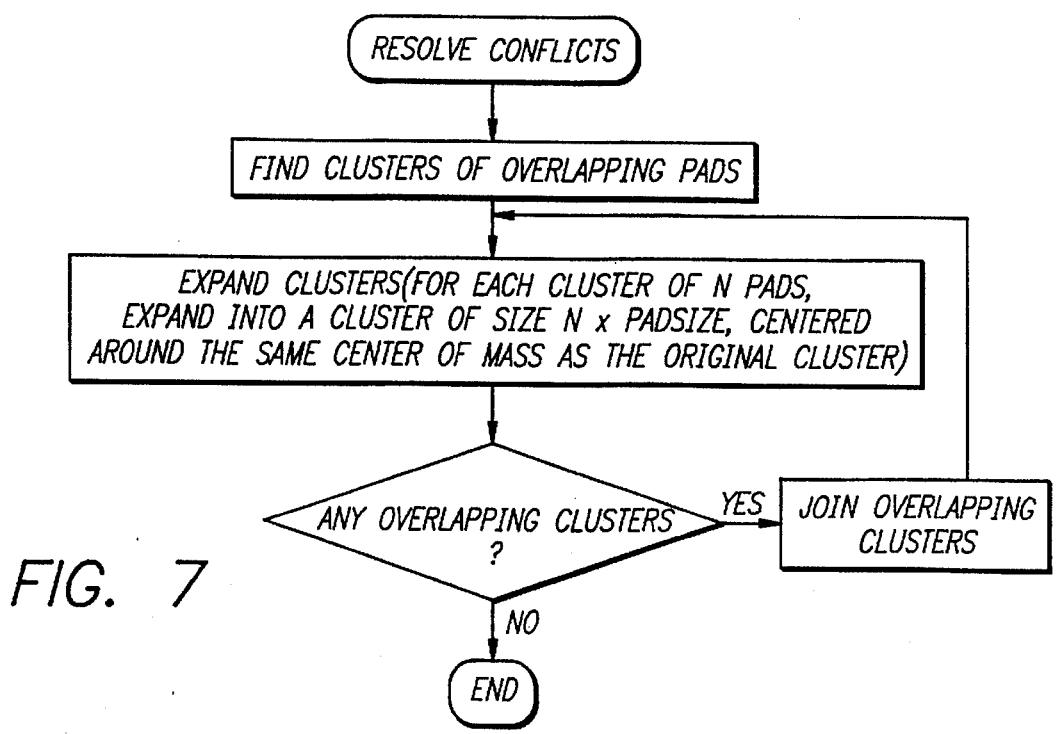
FIG. 7 is a flowchart illustrating the overlap removal methodology of FIG. 6.

The present method removes these conflicts by sorting all pads into "clusters" of overlapping pads, and then expanding each cluster such that all of the pads in the cluster get placed side by side, preserving the center of mass of the cluster as illustrated in the flowchart of FIG. 7.

Because of this expansion, it is now possible for two expanded clusters to conflict with each other. Overlapping clusters get concatenated into a single cluster, expanded again, etc., until all clusters have been expanded and none overlap. Since the expansion of a cluster preserves its center of mass, pads in a cluster will get pushed aside just enough to eliminate all overlap between pads, without moving the pads too far away from their optimal positions.

Another possible method to remove overlap is to iteratively push overlapping pads apart, until the distance between any two pad centers is no less than the width of a pad. However, this method works considerably slower since it acts on individual pads instead of clusters of pads.

After removing the conflicts between overlapping pads, the pad coordinates are translated back into (x,y) coordinates. Both methods will only move the pads that need to be moved away from their optimal positions, and a pad can be moved around a corner to a different side of the chip.

Figure 4:
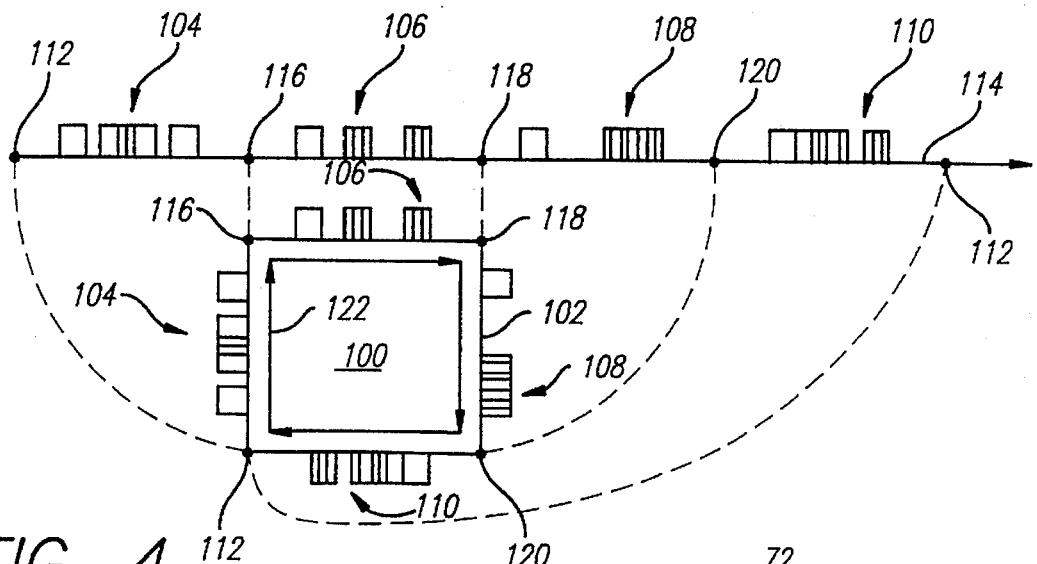
FIG. 4 is a diagram illustrating conversion of rectangular to linear coordinates in accordance with the present method.

The method of converting pad positions from two-dimensional rectangular x,y coordinates into one-dimensional linear "pad" coordinates is illustrated in FIG. 4. A chip 100 has a border 102. Pads that are collectively designated as 104, 106, 108 and 110 are spaced along the left, upper, right and lower edges of the border 102 respectively.

A point 112 at the lower left corner of the border 102 is selected as the origin of the linear coordinate system, which is illustrated as extending along an axis 114. The point 112 can also be selected as the origin of a rectangular coordinate system, or the origin can be elsewhere. The linear coordinates extend from the point 112 to a point 116 at the upper left corner of the border 102, and from there to points 118 and 120 back to the point 112 as indicated by arrows 122.

There is a one-to-one mapping between the rectangular coordinates and the linear coordinates. The coordinate conversion simplifies the operation of expanding clusters of overlapping pads because the positions of the pads can be specified and altered using only one coordinate.

FIGS. 6a to 6d illustrate how clusters of overlapping clusters are expanded in accordance with a preferred form of the present method. Three clusters of overlapping pads 130,132 and 134 are illustrated as having centers of gravity 136, 138 and 140 respectively. The clusters 136 and 140 each include two pads, whereas the cluster 138 includes five pads.

Figure 6A:
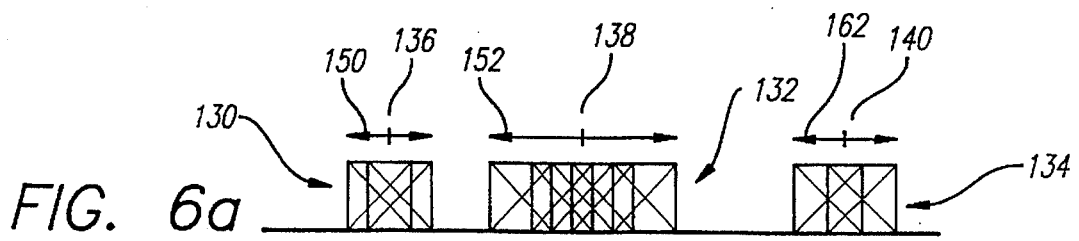
FIG. 6a to 6d are diagrams illustrating pad overlap removal by expansion of clusters of overlapping pads.
Figure 6B:
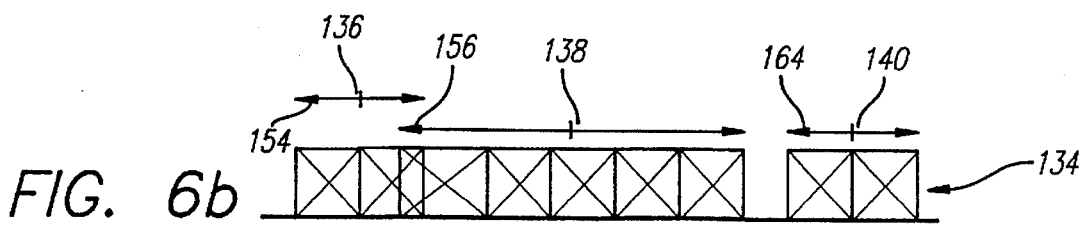

In FIG. 6b, the clusters 136, 138 and 140 are expanded about their centers of gravity by amounts such that the edges of adjacent pads are aligned with each other. Although the cluster 140 remains separate, the clusters 136 and 138 have been concatenated together by this operation.

Figure 6C:
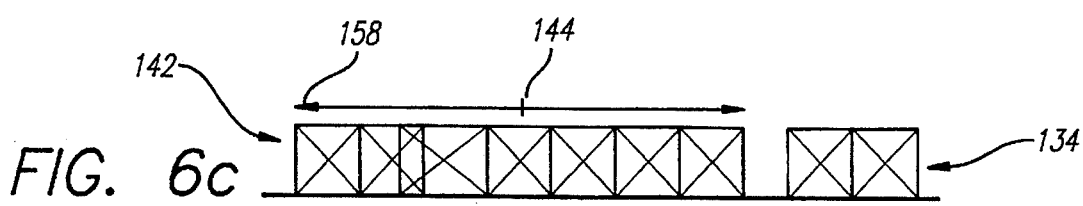
Figure 6D:
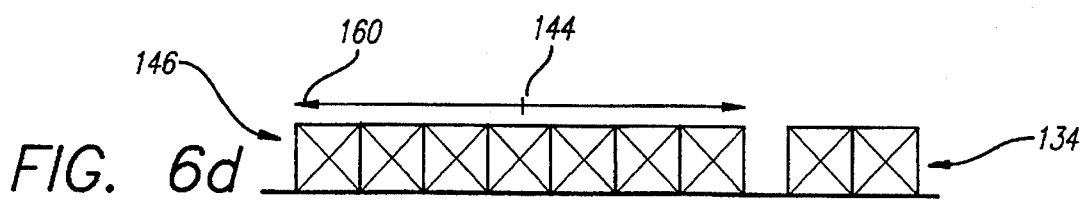

As illustrated in FIG. 6c, the clusters 136 and 138 are then considered as a single new cluster 142 having a composite center of gravity 144. The cluster 142 is expanded about the center of gravity 144 to produce a cluster 146 as illustrated in FIG. 6d with no overlapping pads.

This method preserves the center of gravity of each cluster, and minimizes the increase in total wirelength resulting from expansion of the overlapping clusters.

More specifically, the width of the expanded cluster is calculated by multiplying the padwidth by the number of pads in the cluster. In FIGS. 6a to 6d for example, the clusters 130, 132 and 134 with respective initial clusterwidths of 150, 152 and 152, would after expansion have widths of 154, 156 and 164 respectively.

Given the centers of gravity 136 and 138 for the clusters 130 and 132 respectively, the widths that these clusters would overlap after expansion can be directly deduced, and therefore need to be concatenated into a new cluster 142 containing 7 pads, with a composite center of gravity 144 and a new initial width 158. The new calculated expanded width for this 7-pad cluster will be 160, still centered around the center of gravity 144.

It is not necessary to update the individual pad positions during this calculation. It suffices to keep track of which pads belong to which cluster. All of the expansion and concatenation calculations can be done on a separate data structure (not shown) representing the clusters of pads. Once all of the clusters have been expanded appropriately, the individual pads can be simply assigned to their respective positions within the cluster.

Figure 8A:
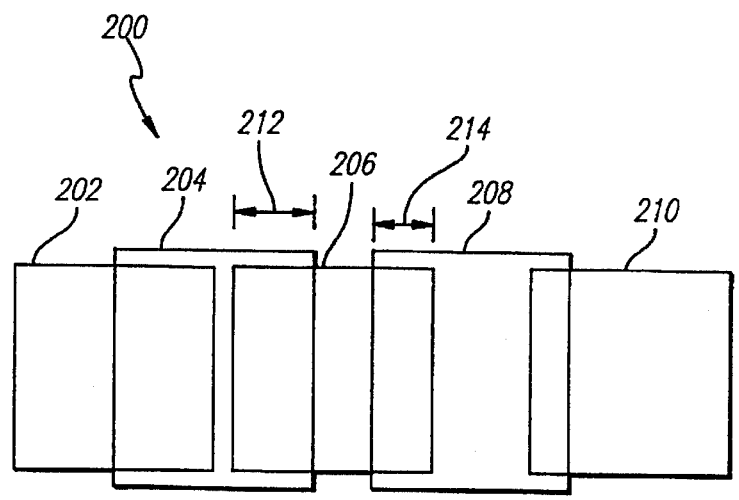
FIGS. 8a to 8c are diagrams illustrating a method of cluster expansion for a cluster having an odd number of pads.
Figure 8B:
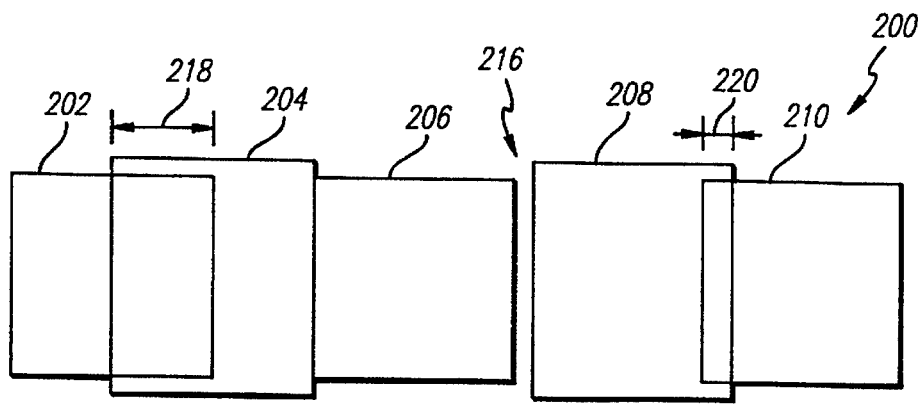
Figure 8C:
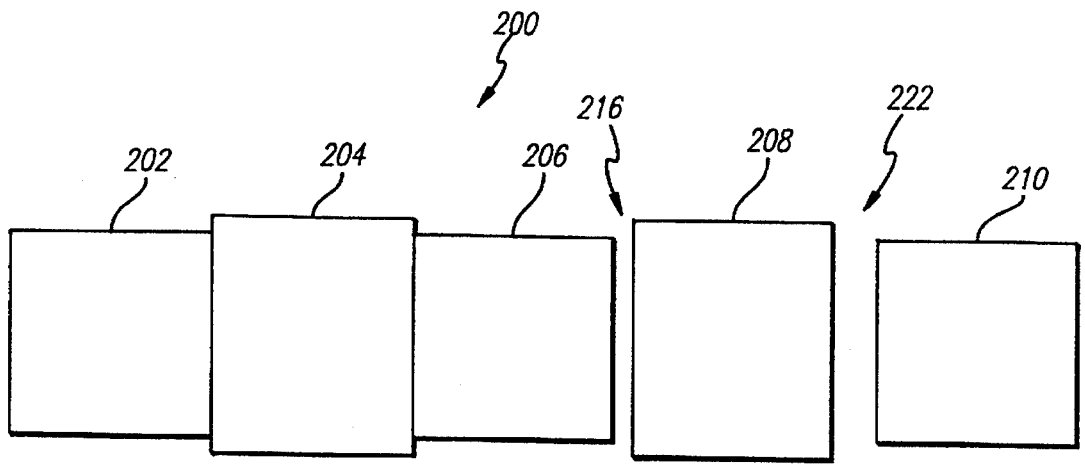

Another, although less preferred method of expanding a cluster of overlapping pads which maintains the original center of gravity thereof is illustrated in FIGS. 8a to 8c for an odd number of pads. Prior to performing the expansion, the pads are sorted in sequential order of increasing distance of their centers along the linear axis as indicated at 114 in FIG. 4.

FIG. 8a illustrates a cluster 200 of five overlapping pads 202, 204, 206, 208 and 210. Although the pads in the illustrated example are all of the same size, alternating pads are illustrated as having different vertical dimensions to enable them to be distinguished apart with greater clarity.

The operation of FIGS. 8a to 8c is performed from the center outwardly. The pads are sorted in ascending order of spacing along the linear axis such that the pad 206 is in the center and is considered first.

The pad 206 is overlapped on the left by the pad 204. The overlap width or distance is designated as 212. Similarly, the pad 206 is overlapped on the right by the pad 208 by a distance 214.

The distances 212 and 214 are compared. The pads 202 and 204 are moved leftwardly and the pads 208 and 210 are moved rightwardly by the greater of the distances 212 and 214. In the illustrated example, the distance 212 is greater than the distance 214.

The result of this operation is illustrated in FIG. 8b. The pad 204 has been shifted leftwardly by the distance 212 such that its right edge coincides with the left edge of the pad 206. However, since the pads 208 and 210 were moved rightwardly by the distance 212, a space 216 is created between the pads 206 and 208 having a width equal to the distance 212 minus the distance 214.

In the next step of the operation, the next most outward overlaps are considered. As illustrated in FIG. 8b, the pad 204 is overlapped by the pad 202 by a distance 218. Similarly, the pad 208 is overlapped by the pad 210 by a distance 220.

Since the distance 218 is larger than the distance 220, the pad 202 is shifted leftwardly and the pad 210 is shifted rightwardly by the distance 218. This produces the configuration illustrated in FIG. 8c, in which the right edge of the pad 202 coincides with the left edge of the pad 204. A space 222 is created between the pads 208 and 210 having a width equal to the distance 218 minus the distance 220.

The methodology illustrated in FIGS. 8a to 8c is advantageous in that the center of gravity of the cluster 200 is the same after performing the operation as it was before. This is because the pads to the left of the center pad 206 were shifted leftwardly by the same distance that the pads to the right of the pad 206 were shifted rightwardly. The method of FIGS. 8a to 8c, however, may considered disadvantageous for certain applications because spaces such as 216 and 222 can be created during the expansion process.

Figure 9A:
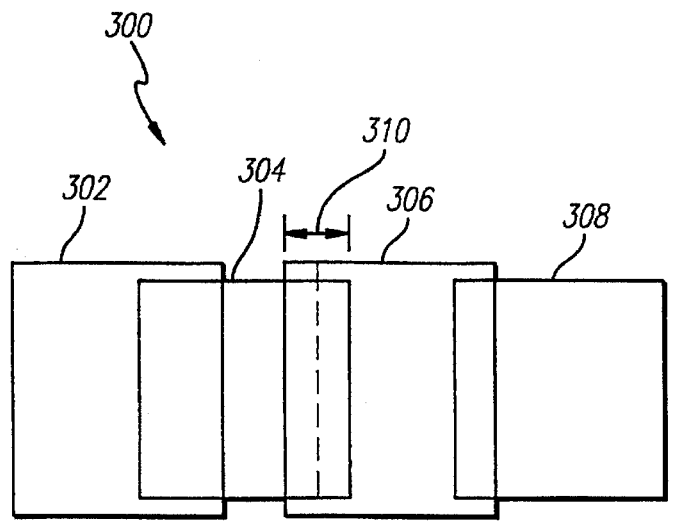
FIGS. 9a to 9c are similar to FIGS. 8a to 8c but illustrate the method for a cluster having an even number of pads.
Figure 9B:
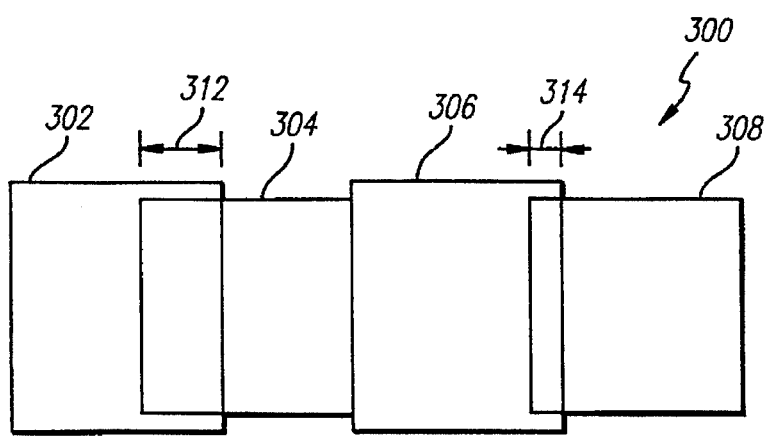
Figure 9C:
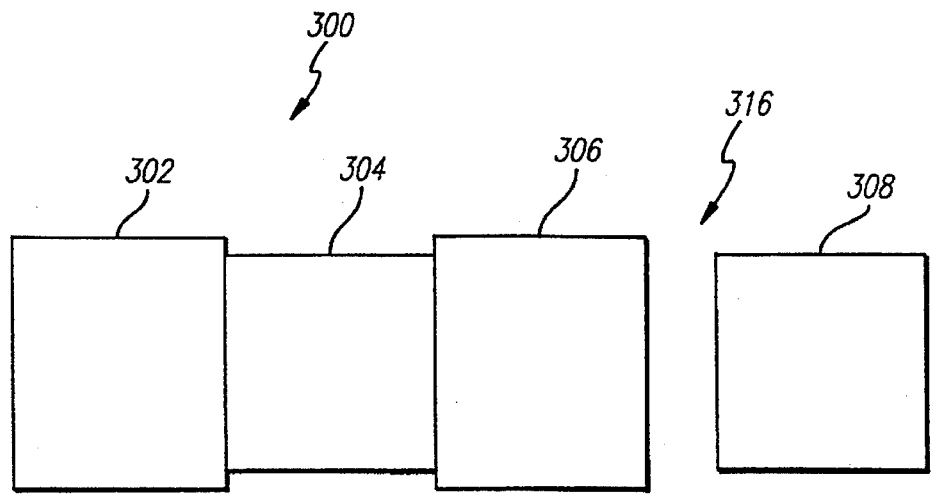

The methodology of FIGS. 8a to 8c is illustrated in FIGS. 9a to 9c for an exemplary case in which the number of overlapping pads in a cluster is even rather than odd. In FIG. 9a, a cluster 300 includes pads 302, 304, 306 and 308. Again, the expansion is performed from the center outwardly, with the pads 304 and 306 being considered first.

The pads 304 and 306 overlap each other by a distance 310. In the next step of the operation, the pads 302 and 304 are shifted leftwardly by one-half the distance 310, whereas the pads 306 and 308 are shifted rightwardly by one-half the distance 310. The result of this operation is illustrated in FIG. 9b, in which the right edge of the pad 304 coincides with the left edge of the pad 306.

Next, the overlap between the pads 302 and 304 is compared with the overlap between the pads 306 and 308. The overlap between the pads 302 and 304, designated as 312, is greater than that between the pads 306 and 308 which is designated as 314. Consequently, the pad 302 is shifted leftwardly and the pad 308 is shifted rightwardly by the distance 312.

This produces the result illustrated in FIG. 9c, in which the right edge of the pad 302 coincides with the left edge of the pad 304. A space 316 is created between the pads 306 and 308 having a width equal to the distance 312 minus the distance 314. As in the example of FIGS. 8a to 8c, the center of gravity of the cluster 300 remains unchanged.

Yet another method of expanding a cluster of pads is illustrated in FIGS. 10a to 10d. This methodology produces a result illustrated in FIG. 10a, in which pads 402, 404, 406, 408 and 410 of a cluster 400 are expanded such that the edges of adjacent pads coincide exactly with each other. Although illuminating the spaces created by the method of FIGS. 8a to 8c and 9a to 9c, the center of gravity of the cluster 400 is not preserved. However, this is not a major drawback, since the original center of gravity of the cluster can be calculated and stored, and the expanded cluster shifted such that its center of gravity becomes the same as the original center of gravity.

Figure 10A:
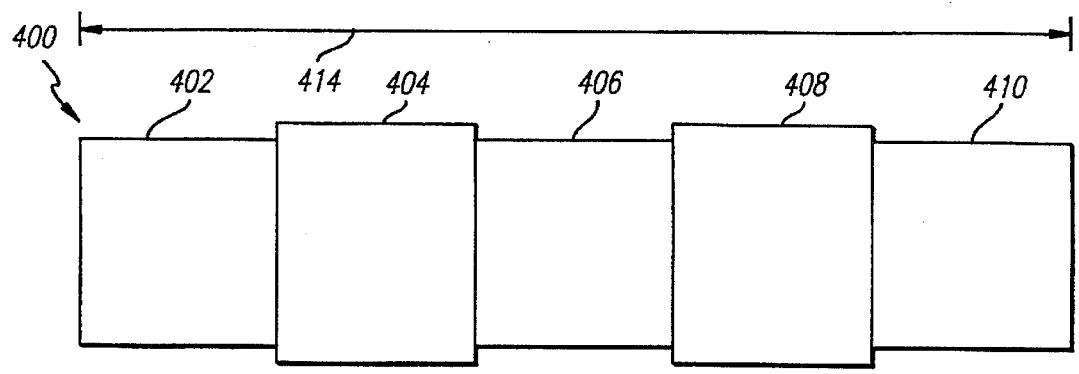
FIGS. 10a to 10d are diagrams illustrating another method of cluster expansion.
Figure 10B:
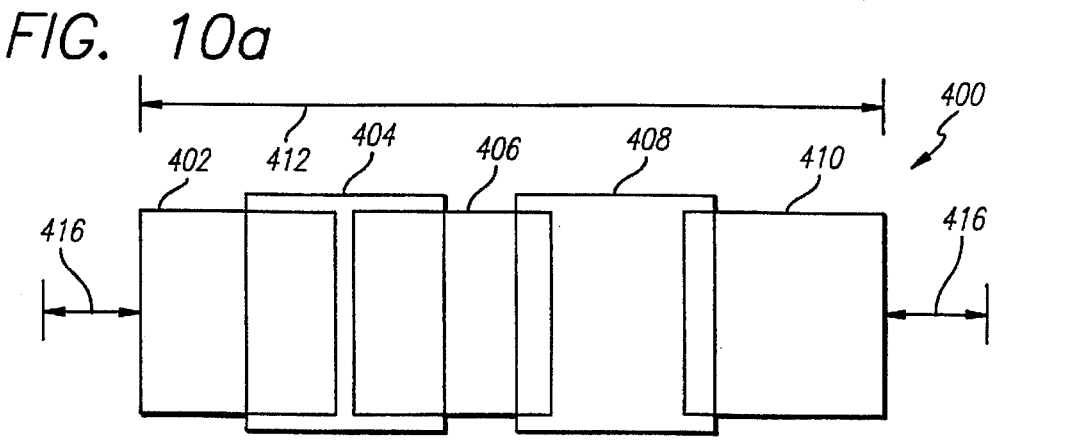

In the method of FIGS. 10a to 10d, the pads of the cluster 400 are initially overlapped as illustrated in FIG. 10b. Whereas the previously described method is performed from the inside outwardly, the method of FIGS. 10a to 10d is performed from the outside inwardly.

The operation begins by calculating a distance 412 between the left and right extremities or edges of the cluster 400. Then, a distance 414 as illustrated in FIG. 10a is calculated as being equal to the number of pads in the cluster 400 multiplied by the width of each pad. The distance 414 is equal to the width of the cluster 400 after it has been expanded.

As further illustrated in FIG. 10b, a distance 416 is calculated as being equal to one-half of the distance 414 minus the distance 412. The pad 402 is moved leftwardly by the distance 416, whereas the pad 410 is moved rightwardly by the distance 416. This produces the configuration illustrated in FIG. 10c, in which a space 418 having a width 420 is created between the pads 402 and 404, and a space 422 having a width 424 is created between the pads 408 and 410.

Figure 10C:
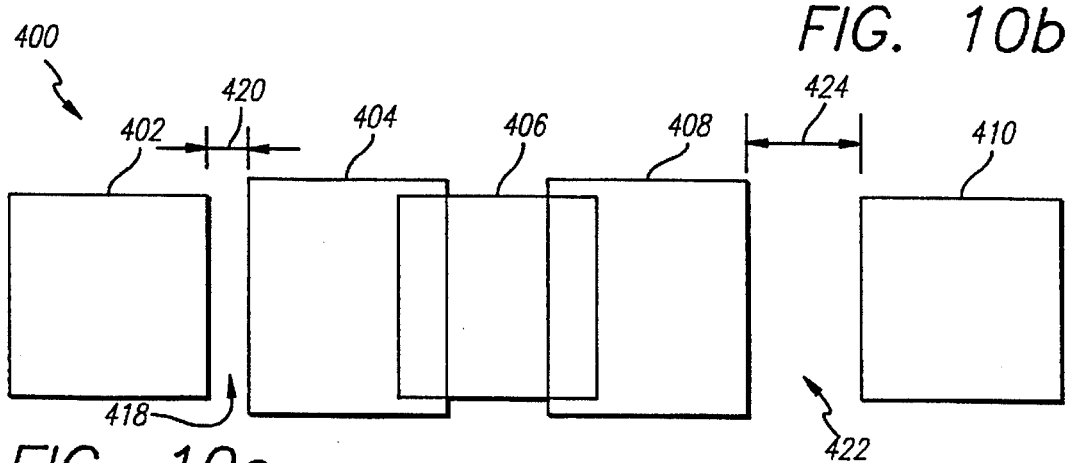

It will be noted that, although not explicitly illustrated, it is possible for overlaps to remain between the pads 402,404 and 408,410 rather than the spaces 418 and 420 after performing the step of FIG. 10c.

In the next step of the method, the pad 404 is moved leftwardly by the distance 420 such that the left edge of the pad 404 coincides with the right edge of the pad 402. In a similar manner, the pad 408 is moved rightwardly by the distance 424 such that the right edge of the pad 408 coincides with the left edge of the pad 410. This produces the configuration illustrated in FIG. 10d.

Figure 10D:
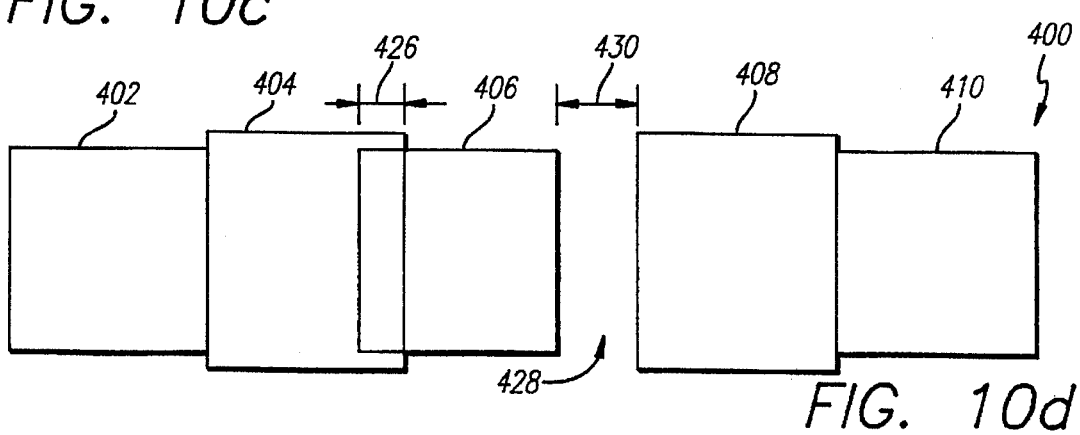

As illustrated in FIG. 10d, the pads 404 and 406 overlap by a distance 426, and a space 428 is created between the pads 406 and 408 having a width 430. Due to the geometry of the configuration, the width 426 is equal to the width 430. In the final step of the operation, the pad 406 is moved rightwardly by the distance 430 to produce the expanded cluster arrangement illustrated in FIG. 10a.

Since the center of gravity of the expanded cluster does not necessarily correspond to the center of gravity of the original cluster, the expanded cluster as illustrated in FIG. 10a is shifted leftwardly or rightwardly as required such that the new center of gravity will coincide with the original center of gravity.

The present method is ideally suited for implementation using the integrated circuit physical design automation system 30 illustrated in FIG. 2. Since the pad positions are located individually after performing the cell placement, a large number of pad positions can be calculated simultaneously in parallel using respective processors of the simultaneous processing architecture 36. The expansion of clusters to remove cell overlap can also be performed simultaneously in parallel on a large number of clusters using respective processors.

Various modifications will become possible for those skilled in the art after receiving the teachings of the present disclosure without departing from the scope thereof.

For example, although the present method has been described and illustrated as being applied to locating terminals in the form of pads on the border of an integrated circuit chip, it is also directly applicable to the problem of pin assignments for a microelectronic circuit block or module, in which the terminals are pins on the border of the block.

We claim:

1. A method for optimally locating a plurality of electrical terminals on a border of a microelectronic circuit that includes a plurality of cells, comprising the steps of:

(a) performing a placement of said cells;

(b) calculating cell interconnect points in said placement corresponding to the electrical terminals respectively;

(c) calculating positions on said border at which distances between said positions and said interconnect points are minimum respectively; and (d) locating the terminals at said positions respectively, in which:

step (c) enables said positions to be calculated such that the terminals can overlap after performing step (d); and the method further comprises the steps, performed after step (d), of:

(e) calculating adjusted positions for said terminals respectively in accordance with a predetermined function such that said overlap is eliminated; and (f) locating the terminals at said adjusted positions respectively;

step (c) comprises calculating said positions in two-dimensional coordinates respectively; and step (e) comprises the substeps of:

(g) converting said positions into one-dimensional coordinates measured along said border respectively;

(h) calculating said adjusted positions in one-dimensional coordinates; and (i) converting said adjusted positions into two-dimensional coordinates.

2. A method for optimally locating a plurality of electrical terminals on a border of a microelectronic circuit that includes a plurality of cells, comprising the steps of:

(a) performing a placement of said cells;

(b) calculating cell interconnect points in said placement corresponding to the electrical terminals respectively;

(c) calculating positions on said border at which distances between said positions and said interconnect points are minimum respectively; and (d) locating the terminals at said positions respectively, in which:

step (c) enables said positions to be calculated such that the terminals can overlap after performing step (d); and the method further comprises the steps, performed after step (d), of:

(e) calculating adjusted positions for said terminals respectively in accordance With a predetermined function such that said overlap is eliminated; and (f) locating the terminals at said adjusted positions respectively;

step (c) comprises calculating said positions in rectangular coordinates respectively; and step (e) comprises the substeps of:

(g) converting said positions into linear coordinates measured along said border respectively;

(h) calculating said adjusted positions in linear coordinates; and (i) converting said adjusted positions into rectangular coordinates.

3. A method for removing overlap between electrical terminals on a border of a microelectronic circuit resulting from initial location of the terminals at positions that allow said overlap, comprising the steps of:

(a) identifying overlapping clusters of terminals;

(b) calculating adjusted positions for said terminals of said clusters respectively in accordance with a predetermined function such that said overlap is eliminated; and (c) locating the terminals at said adjusted positions respectively, in which:

said positions are specified in two-dimensional coordinates prior to performing step (a) respectively; and step (b) comprises the substeps of:

(d) converting said positions into one-dimensional coordinates measured along said border respectively;

(e) calculating said adjusted positions in one-dimensional coordinates; and (f) converting said adjusted positions into two-dimensional coordinates.

4. A method as in claim 3, in which step (b) comprises calculating said adjusted positions such that centers of gravity of said clusters of terminals after performing step (c) are substantially the same as said centers of gravity of said clusters of terminals before performing step (a).

5. A method as in claim 3, in which:

said clusters of terminals can be concatenated to form overlapping new clusters of terminals after performing step (c); and the method further comprises the steps, performed after step (c), of:

(g) identifying said new overlapping clusters of terminals; and (h) calculating new adjusted positions to expand said new clusters of terminals.

6. A method for removing overlap between electrical terminals on a border of a microelectronic circuit resulting from initial location of the terminals at positions that allow said overlap, comprising the steps of:

(a) identifying overlapping clusters of terminals;

(b) calculating adjusted positions for said terminals of said clusters respectively in accordance with a predetermined function such that said overlap is eliminated; and (c) locating the terminals at said adjusted positions respectively, in which:

said positions are specified in rectangular coordinates prior to performing step (a) respectively; and step (b) comprises the substeps of:

(d) converting said positions into linear coordinates measured along said border respectively;

(e) calculating said adjusted positions in linear coordinates; and (f) converting said adjusted positions into rectangular coordinates.

7. A method as in claim 6, in which step (b) further comprises the substep, performed between steps (d) and (e), of:

(g) sorting said positions in accordance with said linear coordinates thereof.

* * * * *